United States Patent [19]
Jaffe et al.

[11] Patent Number: 5,776,553
[45] Date of Patent: Jul. 7, 1998

[54] METHOD FOR DEPOSITING DIAMOND FILMS BY DIELECTRIC BARRIER DISCHARGE

[75] Inventors: Stephen M. Jaffe, Lake Forest, Calif.; Matthew Simpson, Sudbury, Mass.; Cecil B. Shepard, Laguna Niguel; Michael S. Heuser, Foothill Ranch, both of Calif.

[73] Assignee: Saint Gobain/Norton Industrial Ceramics Corp., Worcester, Mass.

[21] Appl. No.: 607,279

[22] Filed: Feb. 23, 1996

[51] Int. Cl.$^6$ .............. B05D 3/06; C23C 16/26
[52] U.S. Cl. .............. 427/577; 427/249; 427/122
[58] Field of Search .............. 427/249, 577, 427/122; 423/446; 118/723 E

[56] References Cited

U.S. PATENT DOCUMENTS

| | | | |
|---|---|---|---|
| 3,736,493 | 5/1973 | Rosenthal et al. | 321/45 R |
| 3,798,457 | 3/1974 | Lowther | 250/532 |
| 3,903,426 | 9/1975 | Lowther | 250/532 |
| 3,919,064 | 11/1975 | Lowther | 204/176 |
| 3,954,586 | 5/1976 | Lowther | 204/176 |
| 4,145,386 | 3/1979 | Rosenthal | 264/22 |
| 4,616,597 | 10/1986 | Kaganowicz | 118/723 |
| 4,770,858 | 9/1988 | Collins | 422/186.18 |
| 4,859,490 | 8/1989 | Ikegaya et al. | 427/38 |
| 4,953,499 | 9/1990 | Anthony et al. | 118/724 |
| 4,970,056 | 11/1990 | Wooten et al. | 422/186.07 |
| 5,104,634 | 4/1992 | Calcote | 423/446 |
| 5,126,164 | 6/1992 | Okazaki et al. | 427/579 |
| 5,182,093 | 1/1993 | Cann | 423/446 |
| 5,194,291 | 3/1993 | D'Aoust et al. | 148/276 |
| 5,340,401 | 8/1994 | Cann | 118/725 |
| 5,403,399 | 4/1995 | Kurihara et al. | 118/723 DC |

FOREIGN PATENT DOCUMENTS 2-80395 of 1990 Japan.

OTHER PUBLICATIONS

M. Segers et al., "Thin Film Deposition Using a Dielectric–barrier Discharge", J. Electrochem. Soc., vol. 138, No. 9, Sep. 1991, pp. 2741–2743.

T. Yokoyama et al., "The Improvement of The Atmospheric–Pressure Glow Plasma Method and the Deposition of Organic Films", Rapid Communication, 1989, pp. 374–377.

B. Eliasson et al., "Nonequilibrium Volume Plasma Chemical Processing", IEEE Transactions on Plasma Science, vol. 19, No. 6, Dec. 1991, pp. 1063–1077.

B. Eliasson et al., "Modelling of Dielectric Barrier Discharge Chemistry", Pure & Appl. Chem., vol. 66, No. 6, pp. 1274–2386, 1994.

S. Kanazawa et al., "Stable Glow Plasma At Atmospheric Pressure", Letter To The Editor, 1988, pp. 838–840.

L. Rosenthal, "Corona Discharge Electrode Concepts In Film Surface Treatment", Soc. Plastic Eng. Tech., 1980, pp. 671–674.

M. Noda et al., "Formation of Diamond Films by Intermittent Discharge Plasma Chemical Vapor Deposition", Jpn. J Appl. Phys. vol. 33 (1994), Part 1, No. 7B, Jul. 1994, pp. 4400–4403.

*Primary Examiner*—Roy V. King
*Attorney, Agent, or Firm*—Volker R. Ulbrich; Martin M. Novack

[57] ABSTRACT

A method is disclosed for depositing diamond film, including the following steps: providing an environment comprising hydrogen gas and a hydrocarbon gas; dissociating hydrogen gas of the environment by dielectric barrier discharge to obtain atomic hydrogen; and providing a deposition surface in the environment and implementing diamond deposition on the deposition surface from the hydrocarbon gas, assisted by the atomic hydrogen. In a preferred embodiment, the atomic hydrogen is transported by molecular diffusion from its dissociation site to the deposition surface.

5 Claims, 7 Drawing Sheets

METHOD FOR DEPOSITING DIAMOND FILMS BY DIELECTRIC BARRIER DISCHARGE

FIELD OF THE INVENTION

This invention relates to synthesis of diamond and, more particularly, to an improved method and apparatus for producing diamond film by chemical vapor deposition.

BACKGROUND OF THE INVENTION

Diamond has many extraordinary properties, including superlative hardness, thermal conductivity, and optical transmissivity. Synthetic diamond produced by chemical vapor deposition has become commercially viable for practical applications such as wear parts, heat sinks, and optical windows. However, while the cost of producing CVD diamond has decreased in recent years, it is still quite expensive, especially high quality CVD diamond.

There are several components that contribute to the relatively high cost of producing synthetic diamond by chemical vapor deposition. One such cost component is the investment in the capital equipment itself. A second cost component is the cost of reagents. For the most common processes (e.g. arc jet plasma CVD, microwave plasma CVD, and hot filament CVD), which use hydrogen-assisted deposition, hydrogen gas and a hydrocarbon gas are the feedstock gases for the deposition process, and the ratio of hydrogen to hydrocarbon is of the order of 100 to 1. In some processes, hydrogen is consumed in relatively large quantities, so the cost of the hydrogen gas can be a very significant component of the cost of producing CVD synthetic diamond. Another very significant cost component of these processes is the electric power cost of dissociating the hydrogen gas ($H_2$) into the atomic hydrogen that is used at the deposition region to assist diamond growth. This cost component can be considered as the product of two related sub-components; namely, the efficiency with which the electric power dissociates the hydrogen, and the efficiency with which the dissociated hydrogen is brought to the deposition surface. The product of these two efficiencies determines the efficiency with which electric power is converted to dissociated hydrogen that is made available at the location at which it is useful in assisting the diamond deposition process.

Existing diamond deposition techniques tend to be inefficient in their use of hydrogen and/or their use of electric power to obtain dissociated hydrogen at the deposition surface. Arc jet plasma techniques have relatively high fixed costs, produce wasteful heating, and transport and use atomic hydrogen convectively and with relatively poor efficiency. Microwave and planar hot filament CVD systems can both create atomic hydrogen over a relatively large, distributed area. High temperature electrons in microwave plasmas efficiently dissociate hydrogen gas with minimal gas heating, but microwave systems employ costly power supplies, raising fixed costs, and they have poor transport efficiency. Planar hot filaments use inexpensive D.C. power, and transport efficiency is high when the filaments are brought close to the deposition surface. However, hot filament systems have very low values of dissociation efficiency, wasting most of the input energy on sensible gas heating.

It is among the objects of the present invention to provide a technique and apparatus for producing synthetic diamond film with increased efficiency and at lower cost.

SUMMARY OF THE INVENTION

Applicants have recognized that diamond film deposition can be improved by using a relatively large area source close to the deposition surface and by relying mainly on molecular diffusion to convey atomic hydrogen to the deposition surface. The use of a relatively large area source close to the deposition surface minimizes losses of atomic hydrogen (the most expensive reagent) and promotes a substantially uniform deposition environment at the deposition surface, thereby minimizing homogeneity problems. Use of small path diffusion, rather than convection, also promotes uniformity and minimizes atomic hydrogen loss.

In accordance with the invention, there is disclosed an apparatus and method for depositing diamond film by chemical vapor deposition. In a form of the apparatus of the invention, a deposition chamber, comprising an environment of hydrogen and a hydrocarbon gas, is provided. Means are provided for dissociating hydrogen gas of the environment by dielectric barrier discharge to obtain atomic hydrogen. Diamond is deposited on a deposition surface from the hydrocarbon gas, assisted by the atomic hydrogen.

In a disclosed embodiment of the invention, the means for dissociating hydrogen gas includes: a first electrode; a second electrode spaced from the first electrode; a dielectric barrier between the first and second electrodes; and means for applying a voltage between said first and second electrodes. In this embodiment, the means for dissociating of hydrogen gas is operative to dissociate hydrogen gas at a distance of less than 10 millimeters from the deposition surface.

The operating frequency should be large enough to provide the required power density and low enough so that the plasma has time to recombine and extinguish between cycles. In a disclosed preferred embodiment, the means for applying a voltage includes means for applying an AC voltage in the range 1 KV to 10 KV (and more preferably in the range 1.5 KV to 3.5 KV), having a frequency in the range 10 KHz to 100 KHz (and more preferably in the range 30 KHz to 50 KHz), and further includes a resonant matching circuit for enhancing the efficient transfer of energy. The operating power density of said deposition is preferably at least 5 W/cm$^2$. This power density is much larger than the power density typically used in dielectric barrier discharge for ozone production applications.

In one of the disclosed embodiments the first electrode is a grid electrode and the second electrode is a solid electrode. The grid electrode is disposed between the solid electrode and the deposition surface. In a form of this embodiment, the dielectric barrier is disposed on the second electrode, which is cooled. The dielectric barrier preferably comprises a covering of a polymer film dielectric having a thickness in the range 15 to 150 microns. As the gas gap breaks down, charge accumulates on the dielectric. The field due to accumulated charge cancels the applied field after a few nanoseconds and the microdischarge extinguishes. Immediately another microdischarge appears at another location in the gap. These microdischarges are randomly distributed in time and space. On average, they uniformly cover the electrode surface. When the applied voltage reaches a maximum (dV/dt=0), the displacement current through the dielectric is zero and all discharges extinguish until the polarity reverses and reaches breakdown amplitude. The dielectric limits the duration of any single discharge, and it also spreads the discharges uniformly over the electrode surface.

Atomic hydrogen created between the grid electrode and the other electrode diffuses to the deposition surface to participate in diamond deposition. The cooled dielectric is non-catalytic, deterring recombination on electrode surfaces. Volume recombination in the gas phase is avoided by spacing the electrodes and the substrate only millimeters apart. At the relatively low operating pressure (preferably in the range 10 to 100 torr, and more preferably less than 40 torr), the time for diffusion over this distance is short compared to the time for volume recombination, and a relatively high transport efficiency, for example 0.75, can be anticipated.

An advantage of the present invention is the efficiency with which the dielectric barrier discharge dissociates hydrogen. Another advantage of the invention is that the dissociated hydrogen can readily diffuse to the deposition surface where it performs its function. Efficiency losses resulting from dissociated hydrogen not being brought to the deposition surface, is minimized. Uniformity is also enhanced by the distributed atomic hydrogen generation and the diffusion thereof. Still another advantage is that dissociated hydrogen which recombines during the deposition process can diffuse to where it will again become dissociated by dielectric barrier discharge, thereby achieving recycling of the hydrogen. These factors tend to reduce the volume of hydrogen gas required for the deposition process and to reduce the electrical power needed to produce a given amount of diamond film. Linear cost scaling with size, and the ability to stack deposition modules and use both sides of electrode and/or substrate surfaces, also tends to reduce capital equipment costs.

Further features and advantages of the invention will become more readily apparent from the following detailed description when taken in conjunction with the accompanying drawings.

DETAILED DESCRIPTION

Figure 1:
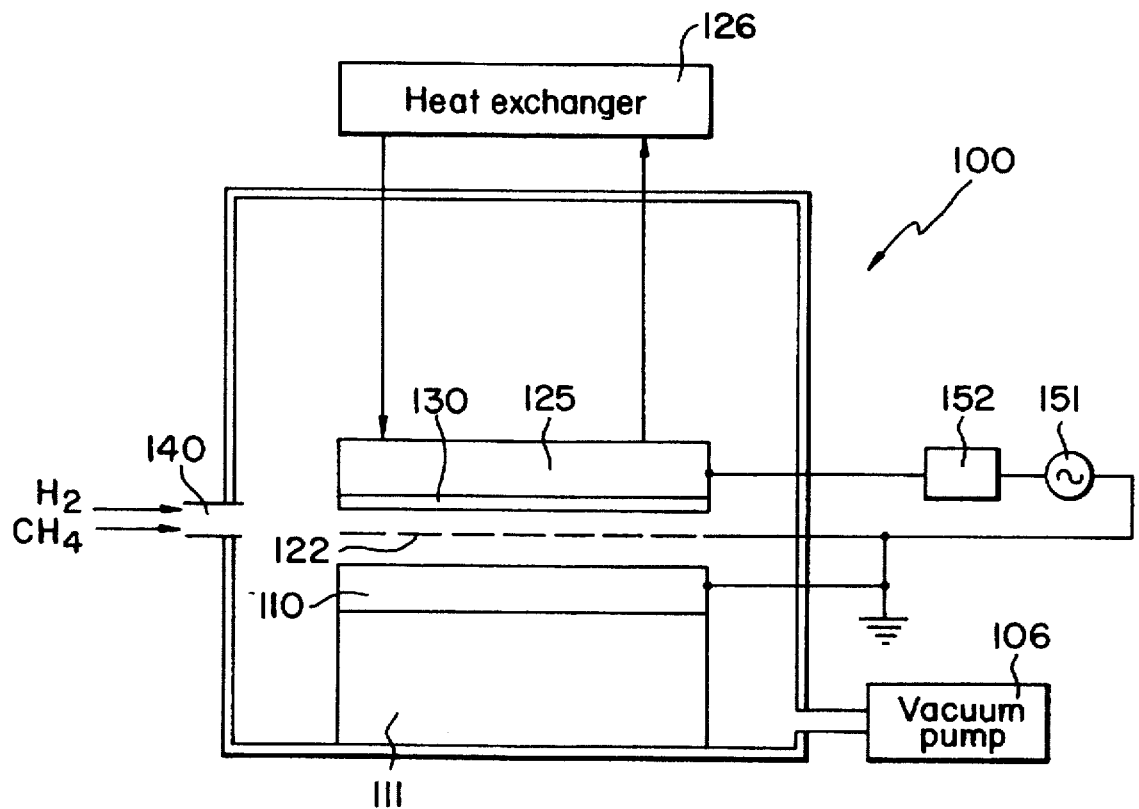
FIG. 1 is a diagram of a system that can be used in practicing an embodiment of the invention.
Figure 2:
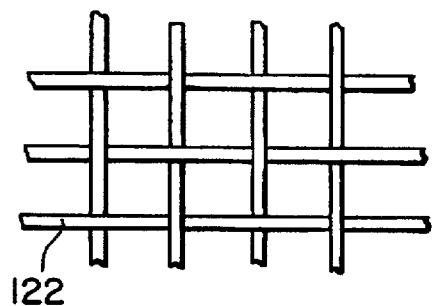
FIG. 2 illustrates the grid of the FIG. 1 embodiment.

Referring to FIG. 1, there is shown a diagram of a system 100 that can be used in practicing an embodiment of the invention. A vacuum chamber 105 is coupled with a vacuum pump 106. A substrate 110 is mounted on a thermally insulating mount or base 111. The base can include a temperature controller. Mounted over and spaced from the substrate 110 is a grid electrode 122 which, in the present embodiment, may be mesh-like screen with a square pattern of conductors, as illustrated in FIG. 2. Mounted over and spaced from the grid electrode 122 is another electrode 125. The face of the electrode 125 that opposes the grid electrode 122 is covered with a dielectric material 130. The substrate 110 and the electrodes 122 and 125 can be of any suitable shape (in this and other related embodiments), for example disc-shaped or rectangular. The electrode 125 can also be temperature controlled, for example with a fluid flow heat exchanger, represented at 126, which cools the electrode and the dielectric. Feedstock gases are input at 140. In the present embodiment, the feedstock gases are hydrogen and a hydrocarbon gas such as methane. Additional gases, for example nitrogen, argon, mercury vapor and/or oxygen, as well as other hydrocarbons can also be included. A high voltage AC source 151, and a matching network 152, are coupled between the grid electrode 122 and the solid electrode 125.

The AC voltage is preferably in the range 1 KV to 10 KV (and more preferably in the range 1.5 KV to 3.5 KV), and preferably has a frequency in the range 10 KHz to 100 KHz (and more preferably in the range 30 KHz to 50 KHz). The substrate 110 which may, for example, be molybdenum coated with titanium nitrate, or graphite, or silicon, is at the same potential (ground, in this case) as the grid electrode 122. The operating power density of the deposition is preferably at least 5 W/cm$^2$. The dielectric barrier preferably comprises a covering of a polymer film dielectric having a thickness in the range 15 to 150 microns. Teflon or Kapton (trademarks of Dupont Company) are among the preferred materials. As the gas gap between electrodes breaks down, at a particular location, charge accumulates locally on the dielectric. The field due to accumulated charge locally cancels the applied field after a few nanoseconds and the microdischarge extinguishes. Immediately another microdischarge appears across the gap at another location. These microdischarges are randomly distributed on the electrode surfaces in time and space. On average, they uniformly cover the electrode surface. When the applied voltage reaches a maximum (dV/dt=0), the displacement current through the dielectric is zero and all discharges extinguish until the polarity reverses and reaches breakdown amplitude. The dielectric limits the duration of any single discharge, and it also spreads the discharges uniformly over the electrode surface.

Atomic hydrogen created between the grid electrode and the other electrode diffuses to the deposition surface to participate in diamond deposition. The cooled dielectric is non-catalytic, deterring recombination on electrode surfaces. Volume recombination in the gas phase is avoided by spacing the electrodes and the substrate only millimeters apart. At the relatively low operating pressure (preferably in the range 10 to 100 torr, and more preferably less than 40 torr), the time for diffusion over this distance is short compared to the time for volume recombination, and a relatively high transport efficiency, for example 0.75, can be anticipated. The preferred pressure-distance product is in the range 10 to 100 torr-cm., with a more preferred range of 20 to 40 torr-cm.

The distance between the average location of hydrogen dissociation (about half way between electrodes 122 and 125 in FIG. 1) and the deposition surface will be a few millimeters, and preferably less than 10 millimeters.

The electrodes can be mounted by any suitable means, for example on small dielectric pegs or spacers extending from the base, or by an insulating frame.

Figure 14:
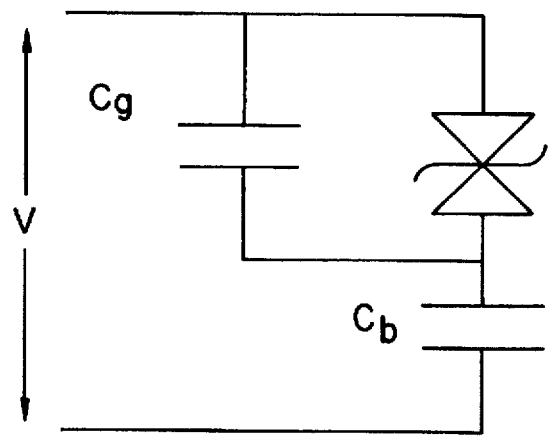
FIG. 14 is a model of the electrical performance of a dielectric barrier discharge.
Figure 15:
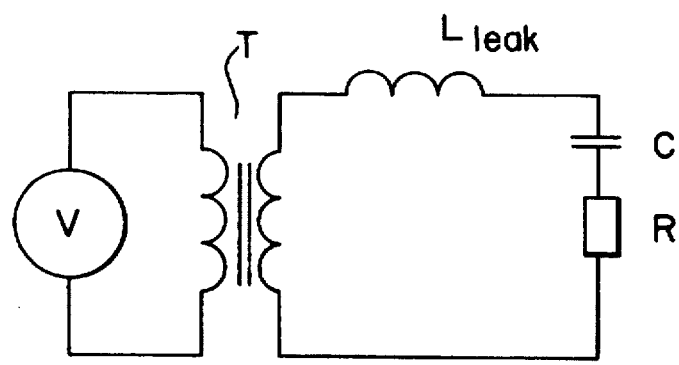
FIG. 15 is a schematic diagram of a prior art dielectric barrier discharge supply circuit.
Figure 16:
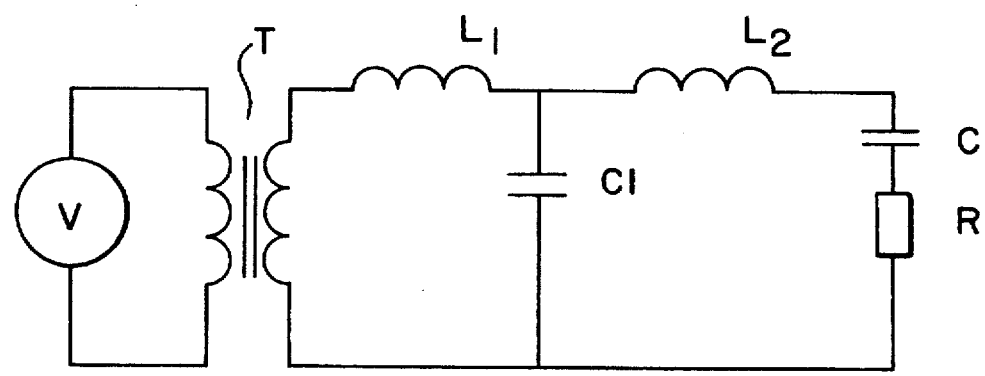
FIG. 16 is a schematic diagram of an improved dielectric barrier discharge supply circuit.

The electrical performance of a dielectric barrier discharge can be modeled by the equivalent circuit of FIG. 14 (see L. Rosenthal, Soc. Plast. Eng. Tech Pap Ann Tech Conf, 1980), where V is the applied voltage, $C_b$ is the barrier capacitance, $C_g$ is the capacitance of the gas gap, and the double anode zener diode represents the breakdown voltage of the gap. The dielectric barrier discharge load is predominantly reactive. It may be approximate by a series capacitor and resistor. For good power transfer a matching network is needed to cancel the load capacitance and to match the supply and load resistance. A typical prior art dielectric barrier discharge supply circuit, shown in FIG. 15, uses the leakage inductance of a step-up transformer to cancel the load capacitance. The circuit includes a transformer T. The typical matching network utilizes the series resonance of the transformer leakage inductance and the load capacitance. While the design of FIG. 15 is economical, it has the drawback of requiring that the applied voltage be much larger than the break down voltage in order to gain power control with voltage. A circuit which gives good power control at VO near Vd is the Tee network of FIG. 16. L1 and C1 resonate at the applied frequency. The Q of this circuit provides enough voltage to break down the gap. L2 is chosen to cancel C once the discharge ignites. The Tee network has the advantage of acting as a low pass filter to remove transients generated in the dielectric barrier discharge.

Power density increases with operating frequency, increased product of dielectric constant ($\epsilon$) and dielectric strength (S), and with breakdown voltage. To achieve power densities that are economically feasible for diamond production, dielectrics are chosen with a high product of $\epsilon$S. The product $\epsilon$S should preferably be greater than 100 KV/mm. This requirement leads to polymer films of fluorocarbons and polyimides, e.g. Teflon and Kapton. By minimizing the thickness of these films, the applied voltage is also minimized for a given power density. Thus, thin films lead to simpler electrical design.

The dielectric films must also be kept thin so that they stay cool. The films are heated by the deposition electrode which operates in the range 400°–1100° C. Typical service temperatures for polymer films are 200°–350° C. For good dielectric performance the operating temperature should be minimized. For a given heat flux, the temperature drop across the film is proportional to its thickness.

The dielectric barrier is heated by radiation and conduction from the adjacent deposition surface. Substantial heating could come from atomic hydrogen recombination on it surface. Besides providing unwanted heat load this recombination represents unwanted loss of the primary diamond growth reagent. Polymer films avoid this loss due to their low sticking probability for H recombination. The cooled film should preferably have a sticking probability of less than $10^{-4}$. Polymer films may be attached to the electrode as free standing films or sprayed on as a coating.

Figure 3:
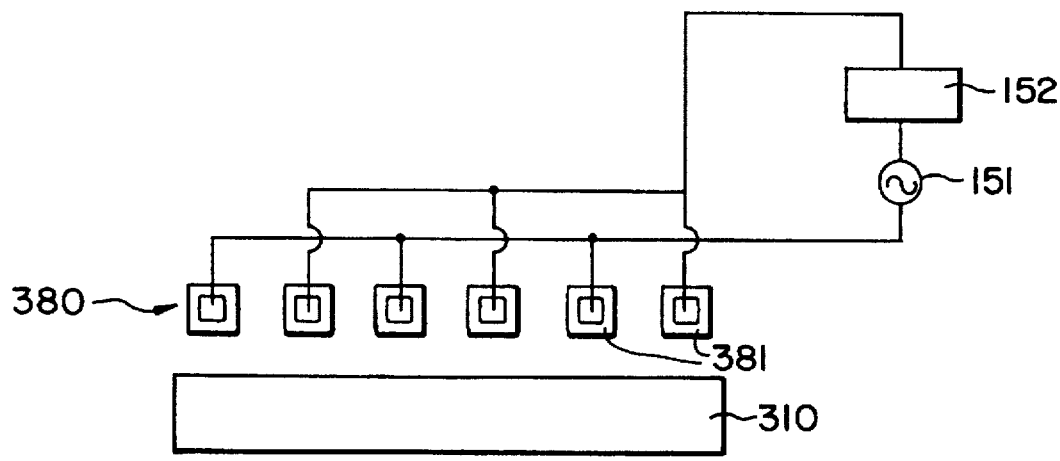
FIGS. 3–13 illustrate further embodiments of the invention for diamond deposition using dielectric barrier discharge.
Figure 4:
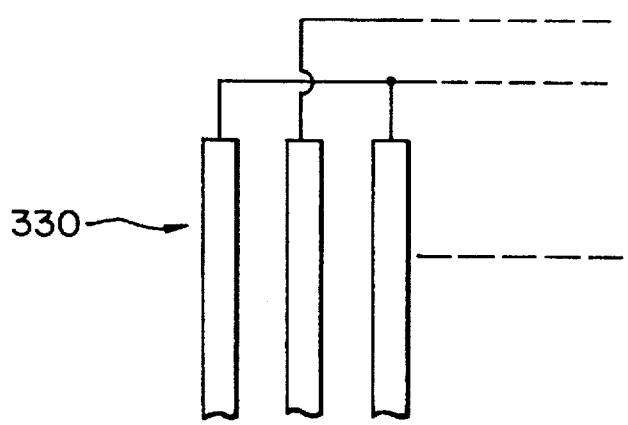
Figure 5:
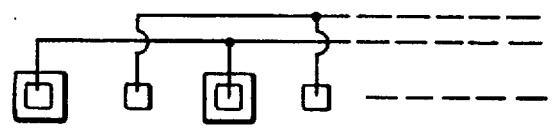

FIG. 3 and subsequent Figures describe further embodiments that can be practiced using equipment and principles of the general type described in conjunction with FIG. 1. In the embodiment of FIG. 3, the solid electrode 125 (of FIG. 1) is not required. FIG. 3 utilizes parallel spaced apart electrodes 380 (also shown in FIG. 3), energized, at alternating polarities, with AC voltage source 151 and matching circuit 152. In FIGS. 3 and 4, the grid electrodes are all covered with a dielectric 381. In the variation of FIG. 5, every other electrode is covered with a dielectric. Cooling of these electrodes and of the dielectrics, an be implemented by circulating fluid through hollow electrode conductors.

Figure 6:
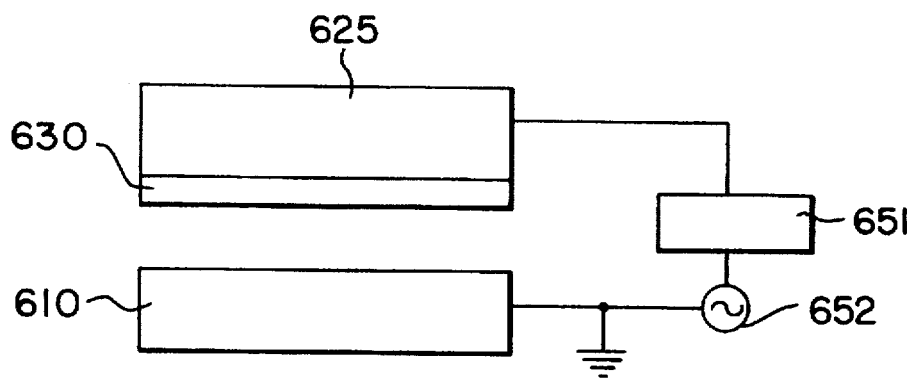

FIG. 6 illustrates another embodiment hereof wherein the electric potential is applied by AC source 651 and matching circuit 652 across spaced apart electrodes 610 and 625, with electrode 625 having dielectric barrier 630. In this case, the diamond deposition is on the electrode 610. It will be understood that if the deposited diamond changes the electrical characteristics during deposition, the AC source and/or matching circuit could be controlled manually or automatically to account therefor.

Figure 7:
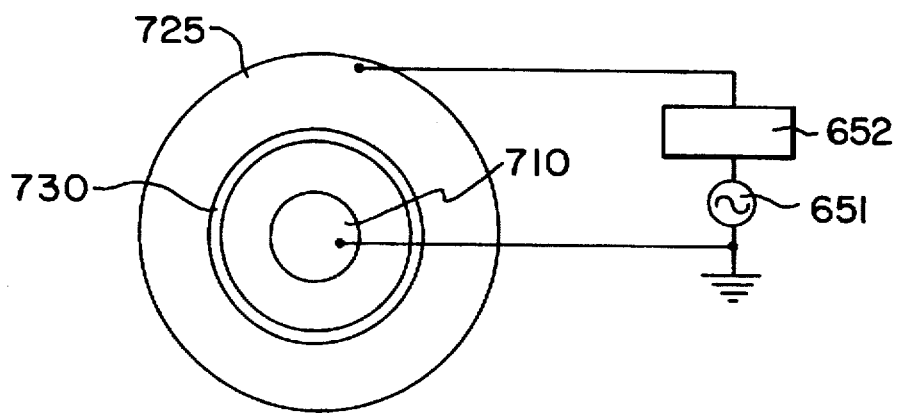

In the embodiment of FIG. 7, electrodes 710 and 725 are energized, as in FIG. 6, by AC source 651 and matching circuit 652. In this case, the electrodes are cylindrically concentric, with a dielectric 730 covering the inner surface of electrode 725. Diamond deposition would be on the surface of the central cylindrical electrode 710. Alternatively, the dielectric could cover the electrode 710, with deposition then being effected on the inner surface of electrode 725. At least the dielectric covered electrode will preferably be cooled by means not shown.

Figure 8:
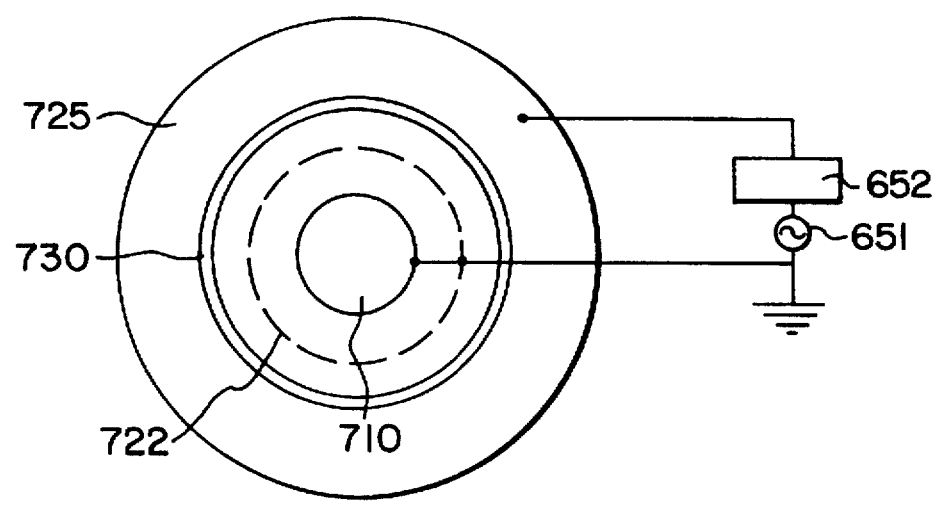

In the arrangement of FIG. 8, a grid electrode 722 (which can, for example, be of the type shown in FIG. 2, but in cylindrical shape) is provided between the solid cylindrical electrodes. In the illustration of the Figure, the dielectric 730 is again shown on the outer electrode 725, and the grid 722 and the inner electrode 710 are at ground potential. Again, however, the dielectric could alternatively be on the inner electrode, with the grid electrode and the outer electrode held at ground potential and the AC voltage applied at the inner electrode, for deposition on the outer electrode.

Figure 9:
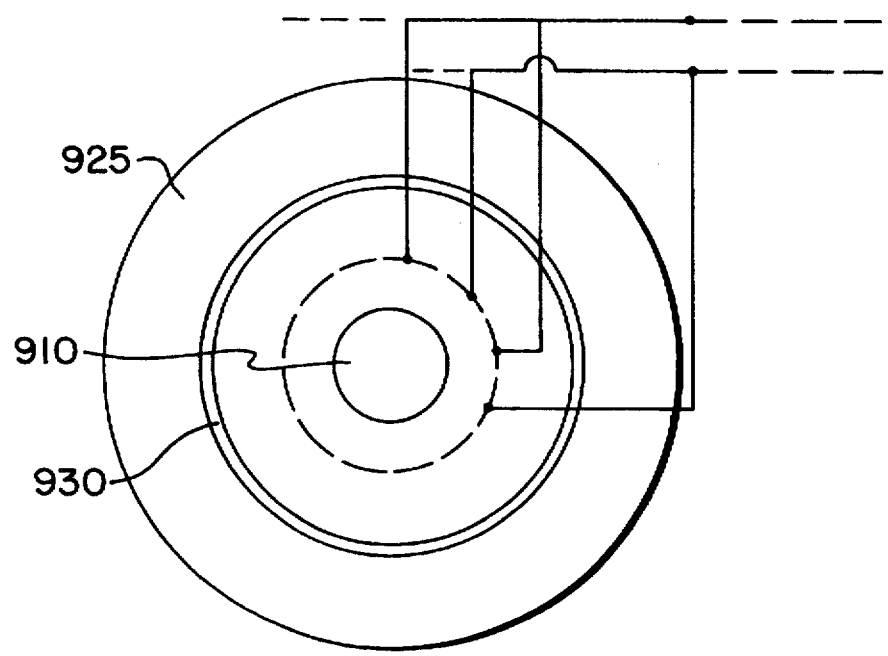

In the configuration of FIG. 9, every other grid is at alternating potential (as in FIGS. 3–5), and diamond deposition can be effected on both the outer surface of substrate 910 and the inner surface of substrate 930. As in FIGS. 3–5, the dielectric can be on every other grid electrode or on every grid electrode, and cooling of the grid can be implemented.

Figure 10:
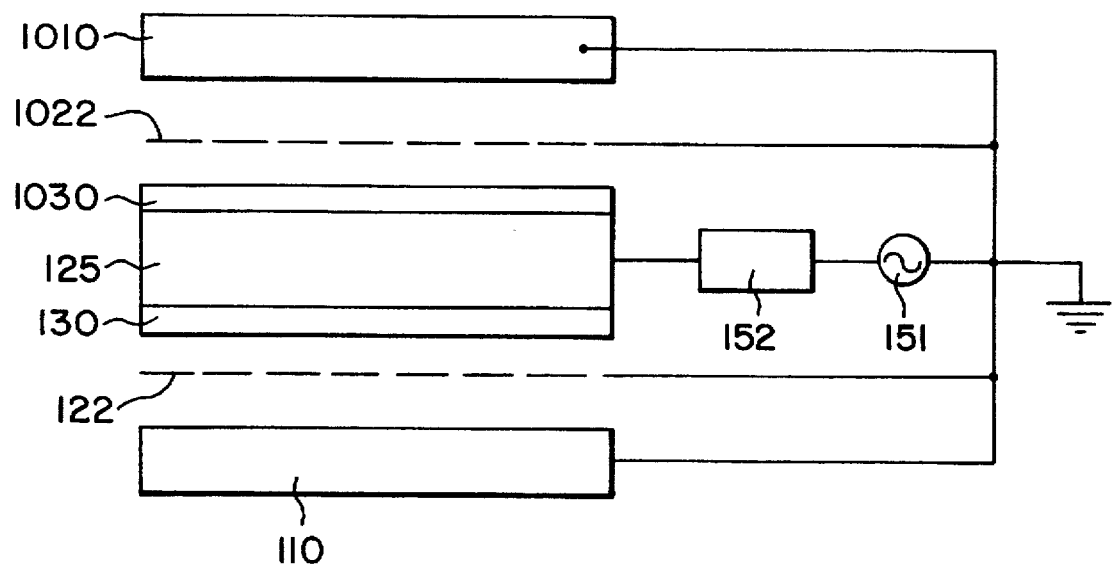

The embodiments of FIGS. 10–13 illustrate how the deposition equipments can be increased in size within a deposition chamber or chambers. The embodiment of FIG. 10 includes substrate 110, grid electrode 122, solid electrode 125, and dielectric covering 130, all of which correspond to like components in FIG. 1. The AC source 151 and matching circuit 152 are also connected as in the FIG. 1 embodiment. In FIG. 10, however, the electrode 125 has a dielectric 1030 covering its top surface, and a further grid electrode 1022 and a further substrate 1010 are also provided, with the grid 1033 and substrate 1010 also being at ground potential. Operation will be as in the FIG. 1 embodiment, but with two (or more, if desired) stacked "subsystems" operating.

Figure 11:
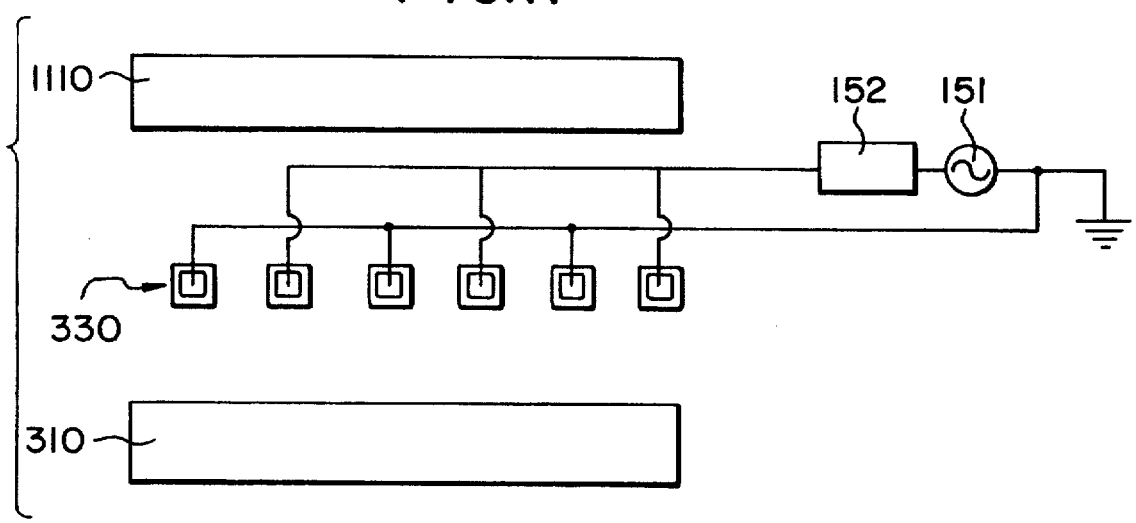

The embodiment of FIG. 11 is seen to be similar to that of FIGS. 3–5, with like reference numerals again representing like components. In this case, in addition to the substrate 310 below, there is also a substrate 1110 above.

Figure 12:
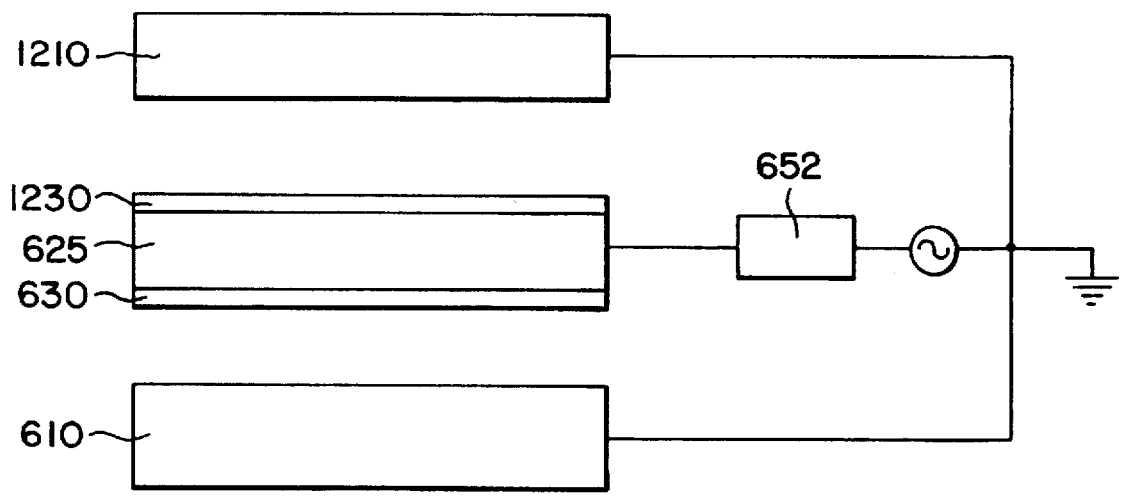
Figure 13:
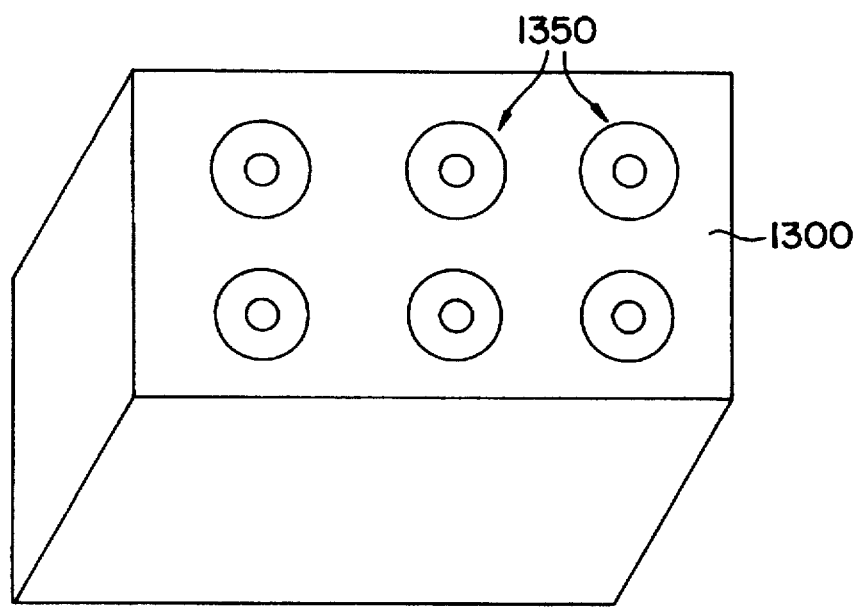

In the embodiment of FIG. 12, like reference numerals again represent like components of FIG. 6. In this case, the electrode 625 includes a top surface covering dielectric 1230, and a further electrode 1210 above, which is coupled in common with electrode 610 and is also used for deposition of diamond. FIG. 13 illustrates a conductive block 1300 which contains several deposition subsystems 1350 that can be like those of FIGS. 7–9. In this illustration, the "outer" electrode will be common to all units, and the central electrodes (or substrates, as the case may be) are isolated therefrom. The grid electrodes of FIGS. 8 and 9 are not shown in this configuration, but can be employed if desired.

The invention has been described with reference to particular preferred embodiments, but variations within the spirit and scope of the invention will occur to those skilled in the art. For example, it will be understood that some of the supply gas could be injected into the reaction region, such as through ports in the electrodes.

We claim:

1. A method for depositing diamond film, comprising the steps of:

providing an environment comprising hydrogen gas and a hydrocarbon gas;

dissociating hydrogen gas of said environment by dielectric barrier discharge to obtain atomic hydrogen; and providing a deposition surface having an area of at least 300 cm² in said environment and implementing diamond deposition on said deposition surface from said hydrocarbon gas, assisted by said atomic hydrogen;

said atomic hydrogen being transported by molecular diffusion from its dissociation site to said deposition surface, and said hydrogen gas being dissociated over an area opposing said deposition surface of at least 300 cm² and at a distance of less than 10 millimeters from said deposition surface.

2. The method as defined by claim 1, wherein the gas pressure of said environment is less than 40 torr.

3. The method as defined by claim 1, further comprising re-dissociating hydrogen gas that has recombined from atomic hydrogen as it assists said diamond deposition.

4. The method as defined by claim 1, wherein the gas pressure of said environment is less than 40 torr, and wherein the pressure-distance product is in the range 10 to 100 torr-cm.

5. The method as defined by claim 3, wherein the gas pressure of said environment is less than 40 torr, and wherein the pressure-distance product is in the range 10 to 100 torr-cm.

* * * * *